US011672098B2

United States Patent
Halli et al.

(10) Patent No.: US 11,672,098 B2
(45) Date of Patent: Jun. 6, 2023

(54) ELECTRONIC DEVICE CONFIGURED TO BE MOUNTED IN A CLUSTER HOUSING AND COMPRISING A FRONT TRAY FOR MOUNTING AT LEAST ONE EXPANSION CARD

(71) Applicant: Atos Global IT Solutions and Services Private Limited, Navi Mumbai (IN)

(72) Inventors: Sanjayakumar Halli, Gadag (IN); Prakash Nagaraja, Bangalore (IN); Sriprada Adiga, Bangalore (IN); Kumar Avinash, Bangalore (IN); Madhu K Sharma, Bantwal taluk (IN); Pravin Kumar Thakur, Bangalore (IN)

(73) Assignee: BULL SAS, Les Clayes Sous Bois (FR)

( * ) Notice: Subject to any disclaimer, the term of this patent is extended or adjusted under 35 U.S.C. 154(b) by 0 days.

(21) Appl. No.: 17/504,455

(22) Filed: Oct. 18, 2021

(65) Prior Publication Data

US 2022/0132694 A1    Apr. 28, 2022

(30) Foreign Application Priority Data

Oct. 22, 2020   (EP) ..................................... 20203326

(51) Int. Cl.
*H05K 7/14* (2006.01)
*H05K 5/02* (2006.01)

(52) U.S. Cl.
CPC ......... *H05K 7/1489* (2013.01); *H05K 5/0221* (2013.01); *H05K 5/0286* (2013.01);
(Continued)

(58) Field of Classification Search
CPC .. H05K 7/1489; H05K 7/1404; H05K 7/1429; H05K 7/1487; H05K 5/0221; H05K 5/0286
See application file for complete search history.

(56) References Cited

U.S. PATENT DOCUMENTS 6,266,250 B1 * 7/2001 Foye ...................... H02B 1/043
                                                    248/220.21
7,167,371 B2 * 1/2007 Coles ................... H05K 7/1409
                                                    360/137

(Continued)

OTHER PUBLICATIONS

European Search Report and Written Opinion issued in EP20203326, dated Apr. 1, 2021 (11 pages).

*Primary Examiner* — Adrian S Wilson
(74) *Attorney, Agent, or Firm* — Arc IP Law, PC; Joseph J. Mayo (57) ABSTRACT

An electronic device configured to be mounted in a housing of a cluster, the device comprising a rear body housing at least one mother board configured to be powered by the cluster, a front tray housing at least one electronic board having at least one socket, the front tray comprising at least one fastening member for mounting an expansion card having an edge connector and a fastening portion, the electronic board being connected to the mother board by at least one flexible cable, the front tray being mounted slidable relatively from the rear body between a close position and an open position in which the front tray is at least partially removed from the cluster housing while keeping the rear body into the cluster housing so that an expansion card can be mounted/unmounted from the electronic board without powering off the device.

14 Claims, 5 Drawing Sheets

(52) U.S. Cl.
CPC ......... *H05K 7/1404* (2013.01); *H05K 7/1429* (2013.01); *H05K 7/1487* (2013.01)

(56) References Cited

U.S. PATENT DOCUMENTS

| | | | |
|---|---|---|---|
| 7,262,958 B2* | 8/2007 | Marroquin | G06F 1/20 |
| 7,362,585 B2* | 4/2008 | Chen | H04M 1/0266 |
| | | | 361/807 |
| 7,782,603 B2* | 8/2010 | Curnalia | G11B 33/122 |
| | | | 361/679.55 |
| 8,154,862 B2* | 4/2012 | Lai | G06F 1/187 |
| | | | 361/679.33 |
| 2004/0022034 A1* | 2/2004 | Coles | H05K 7/20172 |
| | | | 361/726 |
| 2004/0184243 A1 | 9/2004 | Mease et al. | |
| 2006/0268509 A1* | 11/2006 | Marroquin | G06F 1/20 |
| 2008/0239651 A1* | 10/2008 | Curnalia | G11B 33/122 |
| 2011/0007464 A1 | 1/2011 | Leigh | |
| 2015/0163954 A1* | 6/2015 | Goh | G06F 13/102 |
| | | | 361/679.33 |
| 2015/0181746 A1* | 6/2015 | Mullen | H05K 7/1487 |
| | | | 361/752 |
| 2015/0355686 A1* | 12/2015 | Heyd | G11B 33/128 |
| | | | 361/679.31 |
| 2020/0133353 A1 | 4/2020 | Hu et al. | |

* cited by examiner

ELECTRONIC DEVICE CONFIGURED TO BE MOUNTED IN A CLUSTER HOUSING AND COMPRISING A FRONT TRAY FOR MOUNTING AT LEAST ONE EXPANSION CARD

This application claims priority to European Patent Application Number 20203326.2, filed 22 Oct. 2020, the specification of which is hereby incorporated herein by reference.

BACKGROUND OF THE INVENTION

Field of the Invention

Embodiments of the invention relate to a device in which an expansion card has to be mounted when the device is running.

Description of the Related Art

Figure 1:
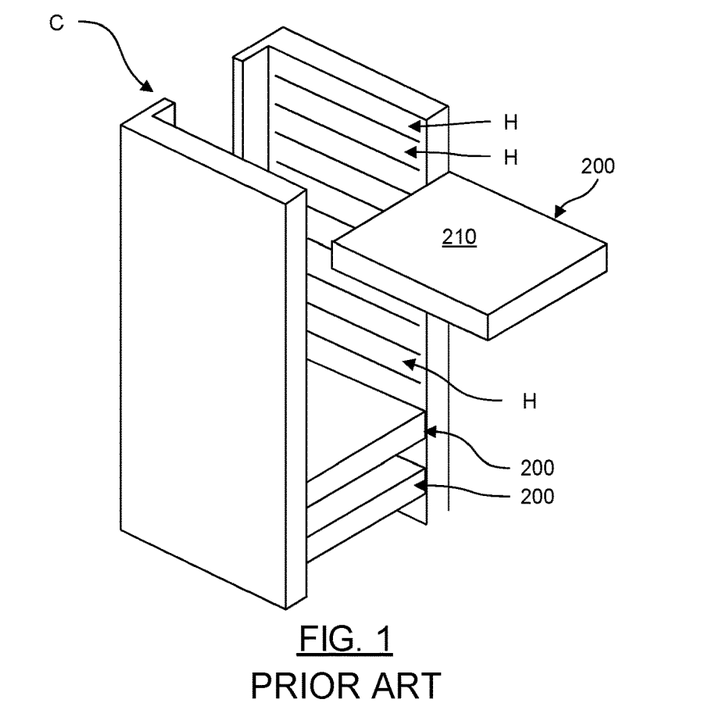
FIG. 1 is a perspective view of a cluster with devices according to prior art.

As illustrated in FIG. 1, a datacenter comprises several devices 200, such as servers, switches and routers, to organize, process and store data. A datacenter also comprises several racks, called "clusters C", arranged in rows within the datacenter and configured to house said devices 200. As represented in FIG. 1, a cluster C comprises two vertical side walls delimiting a central cavity with a front opening, so as to define vertically stacked housings H. Each housing H is configured to house a device 200. Each device 200 comprises, within a main body 210, a mother board with several components (CPU, etc.) and optionally some expansion cards. Each device 200 is connected to a power distribution unit, known as PDU, and to a network thanks to a management node (not represented) located within the cluster C.

When the device 200 is running, the mother board and the expansion cards are electrically powered. If an expansion card is not working and needs to be replaced, the device 200 has to be switched off, removed from the cluster C, opened in order to access to the mother board. After replacement, the device 200 has to be put back in place. The maintenance of a device 200 is time consuming and requires to stop the services running on the device 200, which is a drawback.

Nowadays, expansion cards according to M.2 format are usually used. Such an expansion card is flat and has a rectangular shape. The expansion card comprises at least one processing module and one edge connector configured to be plugged into a socket on the mother board and one fastening portion configured to be secured to the mother board. In practice, a screw is used to secure the fastening portion to the mother board. When mounting such an expansion card, the edge connector is firstly inserted and then a screw is installed on the fastening portion to secure the expansion card. Such an expansion card requires some time for its installation and cannot be replaced directly by the customer.

An objective of one or more embodiments of the invention is to provide a device configured to be mounted into a cluster housing in which expansion cards, such as M.2. expansion cards, can be easily replaced while the device is still running.

BRIEF SUMMARY OF THE INVENTION

One or more embodiments of the invention relate to an electronic device configured to be mounted in a housing of a cluster, the device comprising:
  a rear body housing at least one mother board configured to be powered by the cluster,
  a front tray housing at least one electronic board having at least one socket, the front tray comprising at least one fastening member for mounting an expansion card having an edge connector and a fastening portion,
  the electronic board being connected to the mother board by at least one flexible cable, the front tray being mounted slidable relatively from the rear body between a close position and an open position in which the front tray is at least partially removed from the cluster housing while keeping the rear body into the cluster housing so that an expansion card can be mounted/unmounted from the electronic board without powering off the device.

Thanks to one or more embodiments of the invention, the front tray can be moved from a close position to an open position in which the socket and the fastening member are accessible for an operator. An expansion card can be removed easily without powering off the device.

The fastening member may comprise a latch for securing the mounting of the expansion card. Contrary to a screw which is an independent element, a latch is advantageously attached to the front tray and cannot be lost. The mounting/unmounting of an expansion card is easier and safer.

According to an aspect of the invention, the latch is slidable, for example, horizontally. The latch can be manipulated by an operator with one hand which saves time and avoids any wrong manipulation.

The latch may comprise a spring configured to force the latch in a locking position. The locking is therefore automatic when the fastening portion of the expansion card is in the correct position. The operator doesn't need any tool such as a screwdriver.

According to another aspect of the invention, the front tray comprises at least one locking member configured to secure the front tray with the rear body of the device. The front tray cannot be opened by accident.

The electronic device may be a server.

The at least one flexible cable may transmit information and power so that the electronic board is still running in the open position.

The front tray may comprise sockets and fastening members for mounting at least four expansion cards; in one or more embodiments it may comprise sockets and fastening members for mounting at least eight expansion cards.

According to an aspect of the invention, all the fastening members are located at the periphery of the front tray, for example, along the lateral edges of the front tray. The fastening members are easily accessible for the operator when the front tray is open.

The front tray may comprise a horizontal panel for receiving the electronic board, a vertical front panel and two vertical lateral panels, each vertical lateral panel comprising at least one guiding member. The opening of the front tray is guided so that the flexible cable can be shortened or lengthened without damage. The guiding members increase the lifespan of the device. For example, in one or more embodiments the front tray comprises only four panels, the structure being simple.

One or more embodiments of the invention relate also to an assembly of an electronic device as presented before and at least one expansion card having:
  an edge connector connected in the socket of the electronic board and
  a fastening portion locked by the fastening member of the front tray.

An expansion card may be a M.2 expansion card. Such an expansion card, for example an SSD expansion card, can be immediately replaced without shutting down the device.

One or more embodiments of the invention relate also to a process for mounting an expansion card in the electronic device as presented before, the electronic device being mounted in a housing of a cluster and powered by the cluster, the front tray being in a close position, the process comprising the following steps:

Pulling the front tray relatively from the rear body in the open position in which the front tray is partially removed from the cluster housing while keeping the rear body into the cluster housing and Mounting an expansion card on the electronic board without powering off the device.

BRIEF DESCRIPTION OF THE DRAWINGS

The invention will be better understood by reading the description that follows, only given as an example, and by referring to the appended figures in which.

It should be noted that the figures set out illustrative embodiments of the invention in a detailed manner to implement the invention, said figures obviously being able to serve to better illustrate the invention if need be.

DETAILED DESCRIPTION OF THE INVENTION

Figure 2:
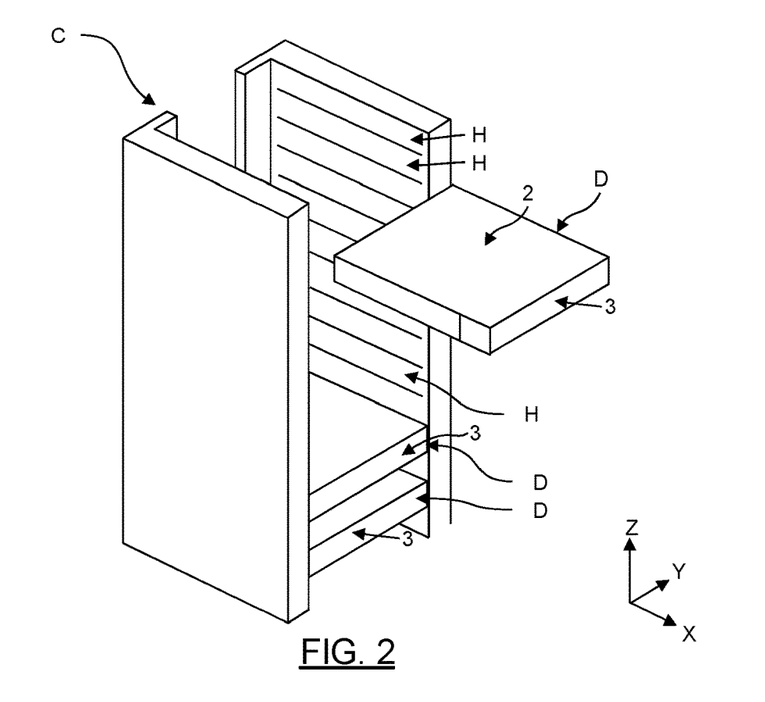
FIG. 2 is a perspective view of a cluster with devices according to an embodiment of the invention.

As illustrated in FIG. 2, a datacenter comprises several devices D, such as servers, switches and routers, to organize, process and store data. A datacenter also comprises several racks, called "clusters C", arranged in rows within the datacenter and configured to house said devices D. As represented on FIG. 2, a cluster C comprises two vertical side walls delimiting a central cavity with a front opening, so as to define vertically stacked housings H. Each housing H is configured to house a device D. Each device D is connected to a power distribution unit, known as PDU, and to a network thanks to a management node (not represented) located within the cluster C.

Each device D is defined in an orthogonal system (X, Y, Z) in which the X axis extends horizontally from the rear to the front, the Y axis extends laterally from the left to the right and the Z axis extends vertically from down to up.

Figure 4:
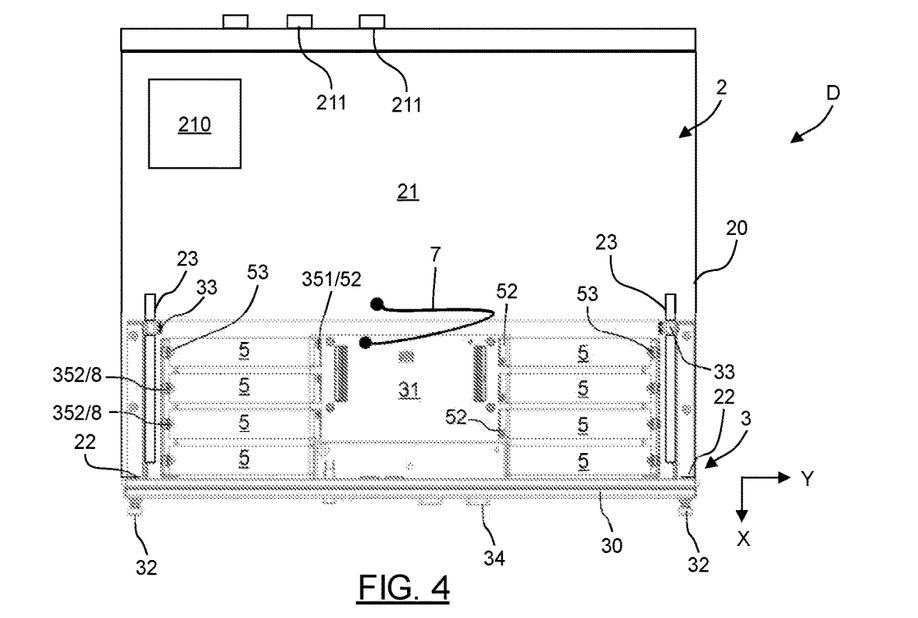
FIG. 4 is a schematic view from the top of a device according to an embodiment of the invention in the close position.
Figure 5:
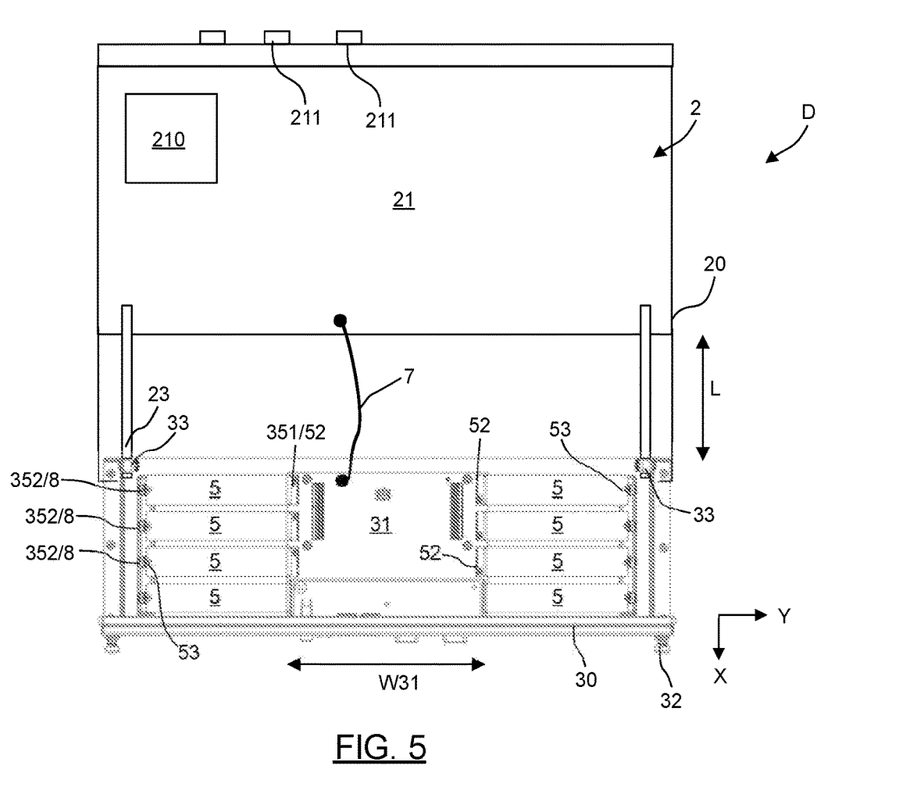
FIG. 5 is a schematic view from the top of a device according to an embodiment of the invention in the open position.

A device D according to one or more embodiments of the invention is represented on FIGS. 4 and 5. In this example, the device D comprises a rear body 2 housing a mother board 21 configured to be powered by the cluster C and a front tray 3 housing an electronic board 31. In this example, the device D is a server but embodiments of the invention may apply to different devices (routers, switch, etc.).

The mother board 21 is a printed circuit board which is known from the person skilled in the art. The mother board 21 comprises for example a processor 210, a memory, etc. The mother board 21 comprises rear connectors 211 for power and communication which are connected to the cluster C.

The electronic board 31 is also a printed circuit board, for example, a NVME back plane. In this example, the electronic board 31 is a slave board whereas the mother board 21 is a master board. As represented on FIGS. 4 and 5, the electronic board 31 comprises several sockets 351 for mounting expansion cards 5, in this example, eight expansion cards 5. It goes without saying that the number of expansion cards 5 could be different. The front tray 3 comprises several fastening members 352 for securing the expansion cards 5 when connected into the sockets 351. In this example, the fastening members 352 doesn't belong to the electronic board 31 but the opposite would be possible.

Figure 6:
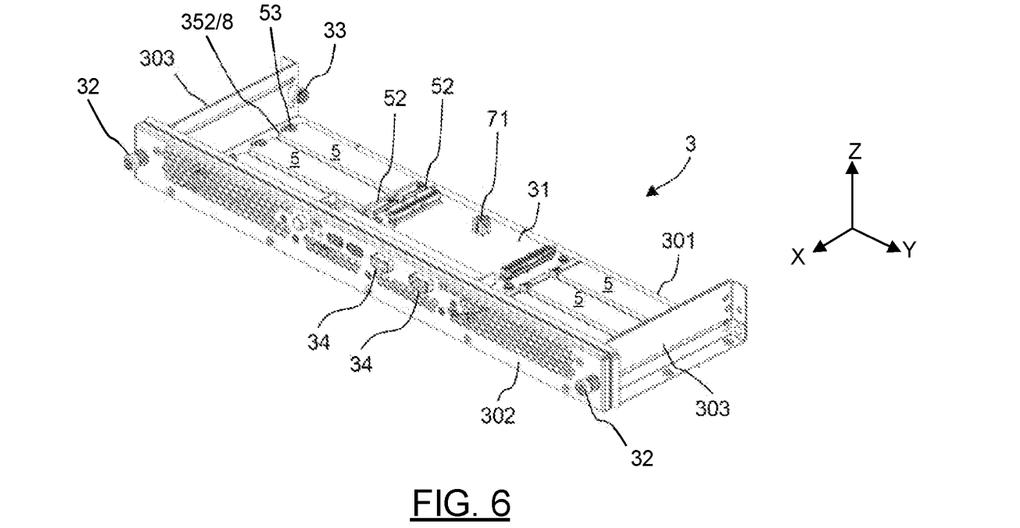
FIG. 6 is a perspective view of a front tray from a device according to an embodiment of the invention.

The mother board 21 is connected to the electronic board 31 by at least one flexible cable 7 in order to power the electronic board 31 and to allow transfer of information between the mother board 21 and the electronic board 31. Thanks to the flexibility and the length of the cable 7, the front tray 3 can be moved relatively from the rear body 2 without disconnecting the electronic board 31 from the mother board 21 as it will be explained later. In FIG. 6, the electronic board 31 comprises a connector 71 for connecting the flexible cable 7.

In this example, each expansion card 5 has a M.2 format which is also known as NGFF (Next Generation Form Factor). One or more embodiments of the invention apply particularly for such M.2 format but also may also apply to other formats. One or more embodiments of the invention apply particularly for an SSD (Solid State Drive) expansion card 5.

Figure 3:
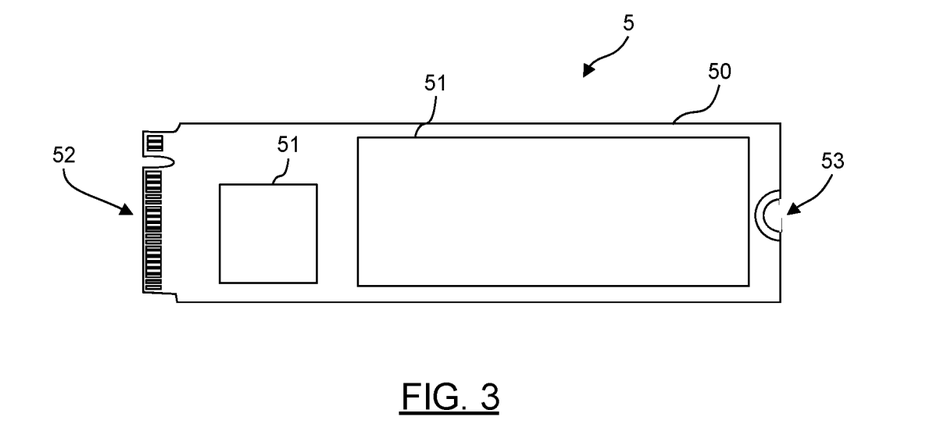
FIG. 3 is a schematic view of an expansion card.

As represented in FIG. 3, each expansion card 5 is flat and has rectangular shape 50. Each expansion card 5 can have a different size. The expansion card 5 comprises at least one processing module 51, for example, a memory chip. Each expansion card 5 comprises one edge connector 52 configured to be plugged into a socket 351 on the electronic board 31 and one fastening portion 53 configured to be secured in order to avoid the removal of the edge connector 52 from the socket 351. The edge connector 52 comprises several pins. The fastening portion 53 is in the form of a recess having the shape of a half circle and is configured to receive a screw as presented in the preamble. The fastening portion 53 is located on the opposite edge of the edge connector 52.

As represented on FIG. 6, the front tray 3 comprises a horizontal panel 301 for receiving the electronic board 31, a vertical front panel 302 and two vertical lateral panels 303.

As represented in FIG. 5, the electronic board 31 has a width W31, defined along the Y axis, which is shorter than the width of the horizontal panel 301. The cost of the electronic board 31 is therefore reduced.

In this example, each vertical lateral panel 303 comprises one guiding member 33, for example, a roller or a slide. The guiding member 33 of the front tray 3 is configured to cooperate with the rear body 2, more particularly, with a guiding surface 23 of the rear body 2 (or a roller), so that the front tray 3 is mounted slidable relatively from the rear body 2 along the X axis in order for the front tray 3 to be at least partially removed from the cluster housing H while keeping the rear body 2 into the cluster housing H. Preferably, the front tray 3 is moved between a close position (use position), where the front tray 3 is in the cluster housing H, and an open position (maintenance position), where the front tray 3 is pulled toward the front. The distance L between the two positions is comprised between 10 cm and 14 cm. Such a distance L allows an operator to have sufficient room for mounting/unmounting expansion cards 5 as it will be presented later.

In this example, the vertical front panel 302 comprises connectors 34, located on the front face, connected to the electronic board 31 as represented on FIG. 6. The front tray 3 comprises two locking members 32 configured to secure the front tray 3 with the rear body 2 in the close position. In this example, the front tray 3 comprises two screws which are located on the left and right portions of the vertical front panel 302. As represented in FIG. 4, the locking members 32 cooperate with trough holes 22 of the rear body 2 so that the front tray 3 is not movable from the rear body 2 in the close position. Preferably, the locking members 32 are mounted captive with the vertical front panel 302.

In this example, the fastening members 352 doesn't belong to the electronic board 31 but belong to the horizontal panel 301 of the front tray 3. Thus, an expansion card 5 extends outside from the electronic board 3 when mounted as represented in FIG. 5.

Figure 7:
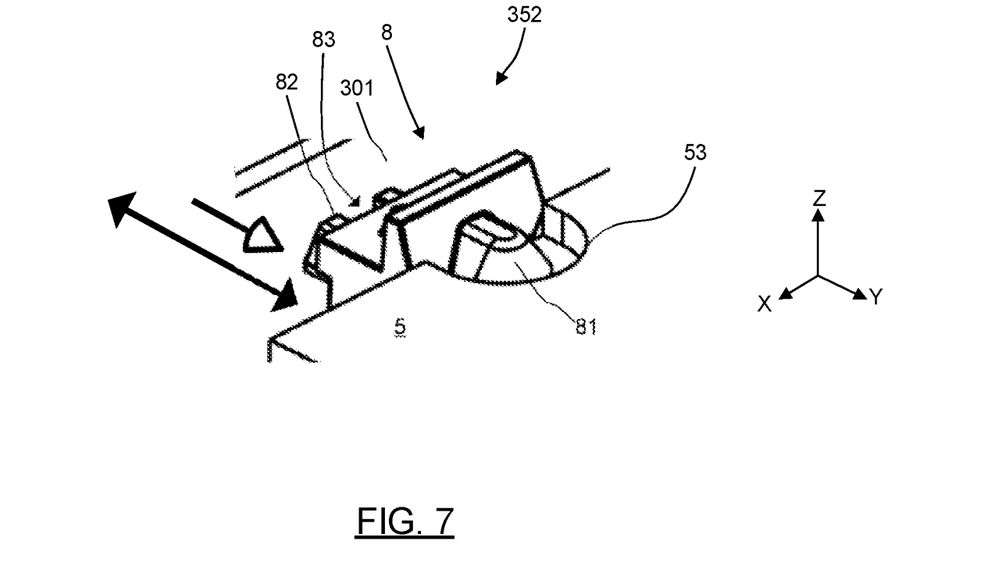
FIG. 7 is a perspective view of a latch from the front tray.

According to an aspect of the invention, each fastening member 352 of the electronic board 31 comprises a latch 8 for securing the mounting of the fastening portion 53 of the expansion card 5 as represented in FIGS. 6 and 7.

In this example, the latch 8 is slidable, for example, horizontally along the Y axis as represented in FIG. 7. Such a latch 8 is easy to manipulate by an operator since the vertical room is limited in a cluster environment. In this embodiment, as represented in FIG. 7, the latch 8 comprises a main body 81 which is slidable on a rail 82 secured to the horizontal panel 301 between a free position and a locking position. Preferably, the latch 8 comprises a spring 83, mounted between the main body 81 and the rail 82, which is configured to force the latch 8 in the locking position. In other words, thanks to the spring 83, the locking is automatic. In one or more embodiments, the spring 83 forces the main body 81 into the recess of the fastening portion 53 of the expansion card 5. In order to secure the expansion card 5 efficiently, the main body 81 has a shape which cooperates with the recess curvature of the fastening portion 53 of the expansion card 5.

In order to facilitate the mounting/unmounting of the expansion cards 5, all the fastening members 352 are located at the periphery of the front tray 3, for example along the lateral edges of the horizontal panel 301 of the front tray 3. In one or more embodiments, all the sockets 351 are located at the periphery of the electronic board 31. Such an arrangement is advantageous since it is easier for an operator to access the fastening members 352 and manipulate the latches 8 from the lateral edges of the tray 3 in the open position. The mounting/unmounting is easy and fast.

Figure 8:
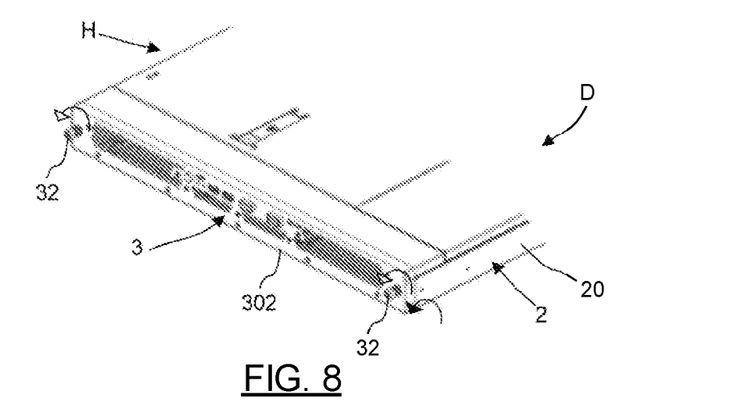
FIGS. 8 to 10 represent schematically the steps for unmounting an expansion card from a device according to an embodiment of the invention.
Figure 9:
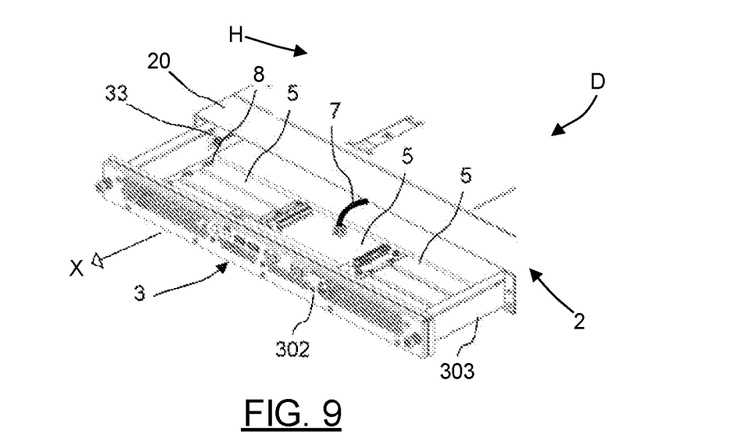
Figure 10:
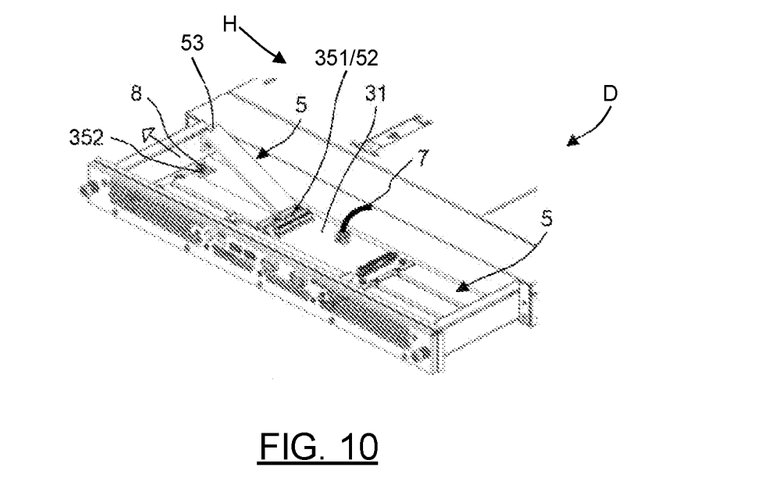

A process for mounting an expansion card 5 in the electronic device D will be now described in reference to FIGS. 8 to 10.

In this example, the electronic device D is mounted in a housing H of a cluster C and powered by the cluster C. The front tray 3 is in a close position (use position).

An operator unlocks the front tray 3 by unscrewing the locking members 32 from the vertical front panel 302 as represented in FIG. 8. The front tray 3 is no more secured to the rear body 2.

An operator pulls the front tray 3 relatively from the rear body 2 in order for the front tray 3 to be at least partially removed from the cluster housing H while keeping the rear body 2 into the cluster housing H as represented in FIG. 9. The front tray 3 slides along the X axis relatively to the rear body 2 thanks to the guiding members 33 in the open position (maintenance position). The front tray 3 extends outside from the cluster housing H along a distance L comprises between 10 cm to 14 cm. It allows on operator to access the electronic board 31 of the front tray 3. Advantageously, the electronic board 31 is still connected to the mother board 21 thanks to the cable 7 which maintains a connection in the close position and in the open position. The device D is still functioning which is very advantageous.

Since the latches 8 are located at the periphery of the front tray 3, and more specifically along the left and right edges of the horizontal panel 301, they are easily accessible for an operator when the front tray 3 is in the open position.

The operator can slide the latch 8 securing the expansion card 5 which needs to be replaced in order to free the fastening portion 53 of the expansion card 5 as represented in FIG. 10. The operation is easy and can be performed with one finger. Due to the connection with the edge connector 52, the expansion card 5 tilts and allows the operator to simply remove the expansion card 5 from the socket 351 of the electronic board 31 as represented in FIG. 10.

Similarly, a new expansion card 5 can be mounted at the same position by inserting the edge connector 52 in the socket 351 and by securing the fastening portion 53 to the horizontal panel 301. The operator manipulates the latch 8 to the free position (against the spring force) to let the fastening portion 53 move towards the horizontal panel 301 and then let the latch 8 moves back to the locking position to secure the expansion card 5 on the horizontal panel 301. The front tray 3 can be put back to the close position and locked.

Thanks to the one or more embodiments of the invention, an expansion card 5 can be replaced by an operator with no waste of time. Advantageously, the replacement can be performed without shutting down the device D which can still run services.

What is claimed is:

1. An electronic device configured to be mounted in a housing of a cluster, the electronic device comprising:
   a rear body that houses a mother board configured to be powered by the cluster;
   a front tray that houses an electronic board having at least one socket,
   the front tray comprising a horizontal panel for receiving the electronic board and at least one fastening member for mounting at least one expansion card, each expansion card of the at least one expansion card having an edge connector and a fastening portion,
   the edge connector of the each expansion card comprising pins and is configured to be plugged into a socket of the at least one socket on the electronic board,
   each fastening member of the at least one fastening member comprising a latch for securing a mounting of the each expansion card, wherein the each fastening member is located at a periphery of the front tray along a lateral edge of the horizontal panel of the front tray,
   the latch being slidable horizontally and comprising a spring configured to force the latch in a locking position, such that locking of the latch in the locking position is automatic;
   wherein the electronic board is connected to the mother board by at least one flexible cable, the front tray is mounted slidable relatively from the rear body between a close position and an open position in which the front tray is at least partially removed from the housing of the cluster while keeping the rear body into the housing of the cluster so that the each expansion card is configured to be mounted and unmounted from the electronic board without powering off the electronic device, the fastening portion of said each expansion card and the each fastening member of the front tray are located on a same side of the electronic device, the latch is located at the periphery of the front tray along an outer edge of the horizontal panel of the front tray, such that the latch is configured to be accessible by an operator when the front tray is in the open position, and such that the latch is configured to be slid to free the fastening portion of the each expansion card to unmount the each expansion card without powering off the electronic device, due to the edge connector being plugged into the socket on the electronic board and upon sliding the latch, the each expansion card is configured to tilt to allow said operator to remove said each expansion card from the socket of the electronic board to unmount said each expansion card.

2. The electronic device according to claim 1, wherein the front tray further comprises at least one locking member configured to secure the front tray with the rear body of the electronic device.

3. The electronic device according to claim 1, wherein the electronic device is a server.

4. The electronic device according to claim 1, wherein the at least one flexible cable transmits information and power.

5. The electronic device according to claim 1, wherein the at least one expansion card comprises at least four expansion cards, the at least one socket comprises a plurality of sockets and at the at least one fastening member comprises a plurality of fastening members for mounting the at least four expansion cards.

6. The electronic device according to claim 1, wherein the least one expansion card comprises at least eight expansion cards, the at least one socket comprises a plurality of sockets and the at least one fastening member comprises a plurality of fastening members for mounting the at least eight expansion cards.

7. The electronic device according to claim 5, wherein all of the plurality of fastening members are located at the periphery of the front tray.

8. The electronic device according to claim 7, wherein all of the plurality of fastening members are located along said lateral edge of the front tray.

9. The electronic device according to claim 1, wherein the front tray further comprises a vertical front panel and two vertical lateral panels, each vertical lateral panel comprising at least one guiding member.

10. The electronic device according to claim 1, further comprising said at least one expansion card, wherein
said edge connector of said each expansion card of the at least one expansion card is connected in a socket of the at least one socket of the electronic board; and,
said fastening portion is locked by the at least one fastening member of the front tray.

11. The electronic device according to claim 10, wherein the at least one expansion card is a M.2 expansion card.

12. A process for mounting an expansion card in an electronic device, the electronic device being mounted in a housing of a cluster and powered by the cluster,
wherein the electronic device comprises
a rear body that houses a mother board configured to be powered by the cluster;
a front tray that houses an electronic board having at least one socket,
the front tray comprising a horizontal panel for receiving the electronic board and at least one fastening member for mounting at least one expansion card, each expansion card of the at least one expansion card having an edge connector and a fastening portion,
the edge connector of the each expansion card comprising pins and is configured to be plugged into a socket of the at least one socket on the electronic board,
each fastening member of the at least one fastening member comprising a latch for securing a mounting of the each expansion card, wherein the each fastening member is located at a periphery of the front tray along a lateral edge of the horizontal panel of the front tray, the latch being slidable horizontally and comprising a spring configured to force the latch in a locking position, such that locking of the latch in the locking position is automatic;
wherein
the electronic board is connected to the mother board by at least one flexible cable,
the front tray is mounted slidable relatively from the rear body between a close position and an open position in which the front tray is at least partially removed from the housing of the cluster while keeping the rear body into the housing of the cluster so that the each expansion card is configured to be mounted and unmounted from the electronic board without powering off the electronic device,
the fastening portion of said each expansion card and the each fastening member of the front tray are located on a same side of the electronic device,
the latch is located at the periphery of the front tray along an outer edge of the horizontal panel of the front tray, such that the latch is configured to be accessible by an operator when the front tray is in the open position, and such that the latch is configured to be slid to free the fastening portion of the each expansion card to unmount the each expansion card without powering off the electronic device;
due to the edge connector being plugged into the socket on the electronic board and upon sliding the latch, the each expansion card is configured to tilt to allow said operator to remove said each expansion card from the socket of the electronic board to unmount said each expansion card;
the front tray being in said close position, the process comprising:
pulling the front tray relatively from the rear body in the open position in which the front tray is partially removed from the housing of the cluster while keeping the rear body into the housing of the cluster; and,
mounting the each expansion card on the electronic board without powering off the electronic device.

13. The electronic device according to claim 1, further comprising said at least one expansion card, wherein the fastening portion of the each expansion card is in a form of a recess comprising a shape of a half circle configured to receive a screw to avoid removal of the edge connector from a socket of the at least one socket associated with the each expansion card.

14. The electronic device according to claim 1, further comprising said at least one expansion card, wherein the fastening portion is located on an opposite end of the each expansion card from the edge connector of the each expansion card, such that the fastening portion is on one end of the each expansion card and the edge connector is on an opposing end of the each expansion card.

\* \* \* \* \*